United States Patent [19]
Iwahashi et al.

[11] Patent Number: 4,467,457
[45] Date of Patent: Aug. 21, 1984

[54] NONVOLATILE SEMICONDUCTOR MEMORY DEVICE

[75] Inventors: Hiroshi Iwahashi, Yokohama; Masamichi Asano, Musashino, both of Japan

[73] Assignee: Tokyo Shibaura Denki Kabushiki Kaisha, Japan

[21] Appl. No.: 329,059

[22] Filed: Dec. 9, 1981

[30] Foreign Application Priority Data

| Dec. 12, 1980 | [JP] | Japan | 55-175296 |
| Mar. 3, 1981 | [JP] | Japan | 56-30213 |
| Mar. 13, 1981 | [JP] | Japan | 56-36350 |
| Apr. 17, 1981 | [JP] | Japan | 56-57929 |
| Jul. 10, 1981 | [JP] | Japan | 56-107689 |
| Jul. 10, 1981 | [JP] | Japan | 56-107694 |

[51] Int. Cl.³ .......................................... G11C 11/21
[52] U.S. Cl. .................................. 365/228; 365/174
[58] Field of Search .......................... 365/174, 228; 307/238.1, 238.3

[56] References Cited

U.S. PATENT DOCUMENTS

| 3,922,650 | 11/1975 | Schaffer | 365/228 X |
| 4,094,012 | 6/1978 | Perlegos et al. | 365/226 |
| 4,123,799 | 10/1978 | Peterson | 365/205 |

Primary Examiner—Robert L. Richardson
Attorney, Agent, or Firm—Finnegan, Henderson, Farabow, Garrett & Dunner

[57] ABSTRACT

Disclosed is a nonvolatile semiconductor memory device in which the difference in level between a reference signal and the output signal of a memory array formed of floating gate MOS FETs is decided by means of a differential sense amplifier, and the result of the decision provides memory data. The reference signal is produced by a gate signal generator which produces a gate signal at a fixed voltage level at the time of testing and a gate signal at a voltage level obtained by dividing the supply voltage at the time of normal reading, and a reference signal generator which produces a reference signal at a level corresponding to the conductive resistance of a floating gate MOS FET with the same configuration of each memory cell whose control gate is supplied with the gate signal.

17 Claims, 26 Drawing Figures

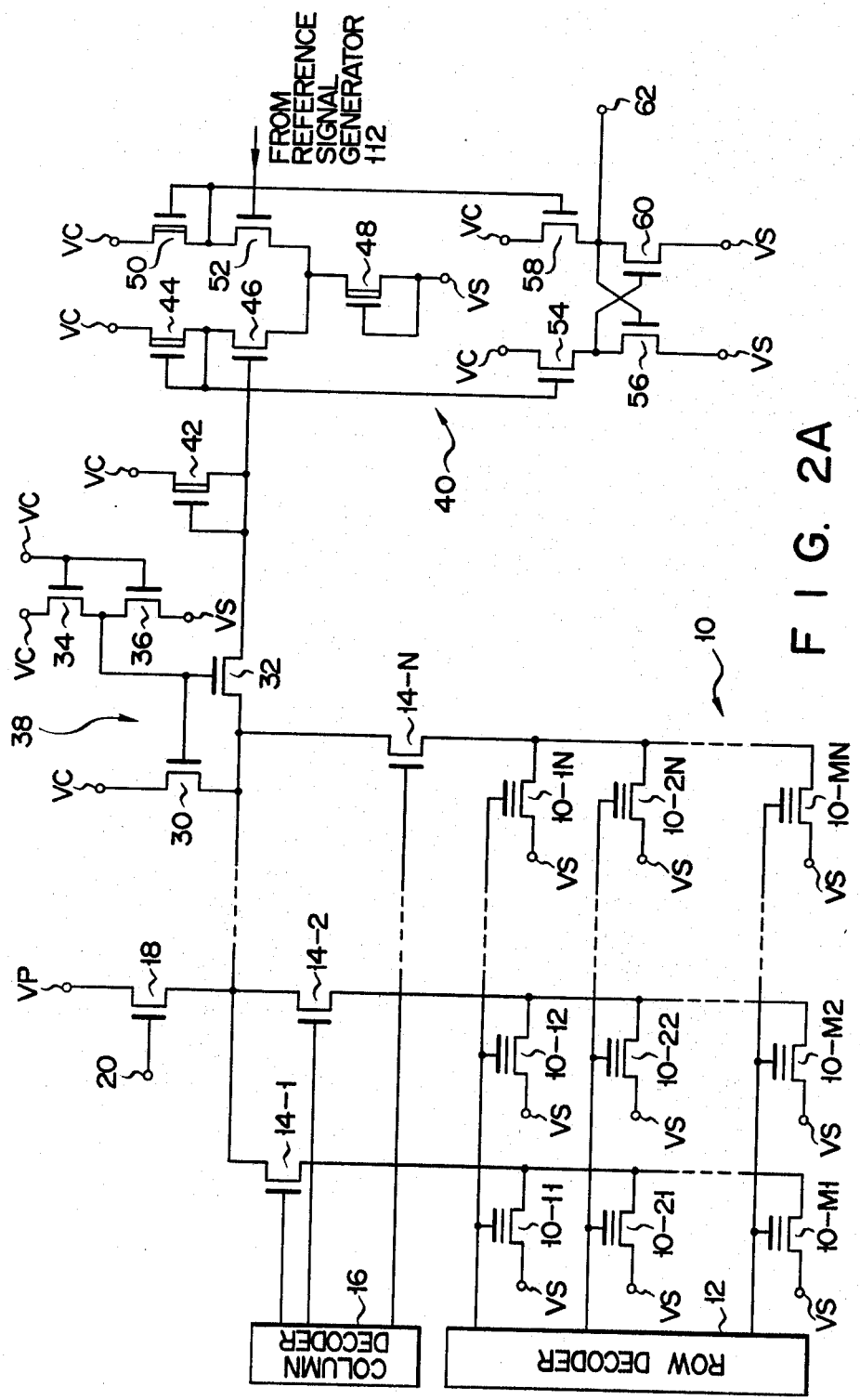
F I G. 2A

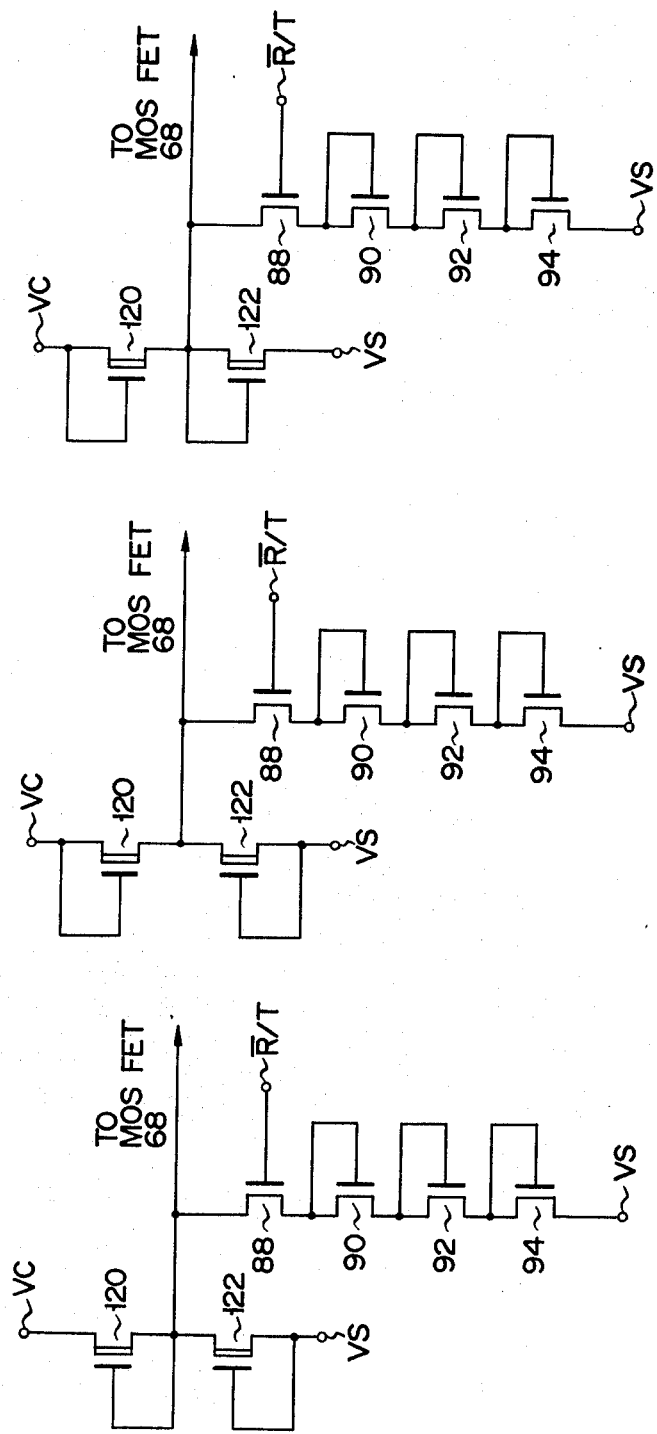

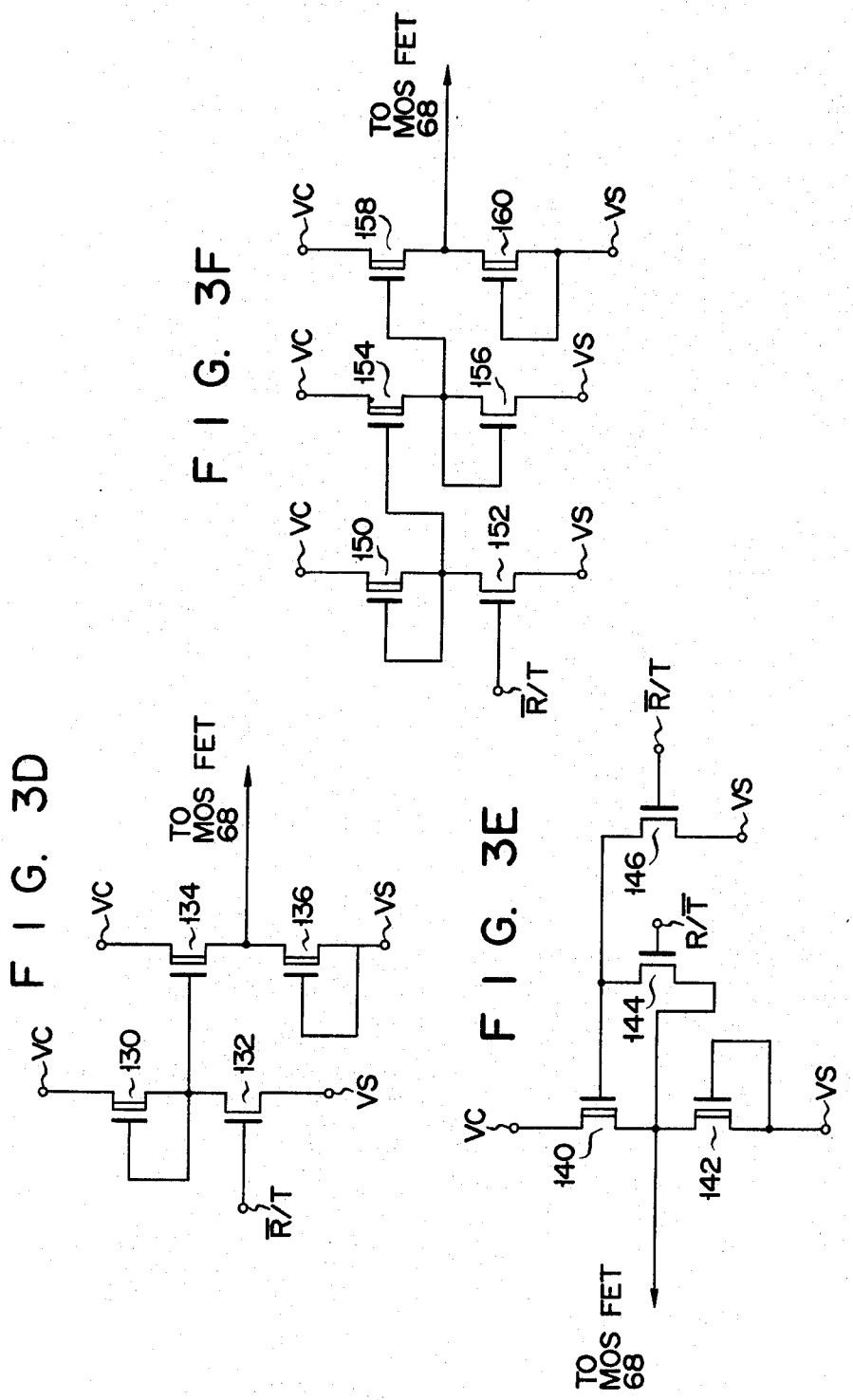

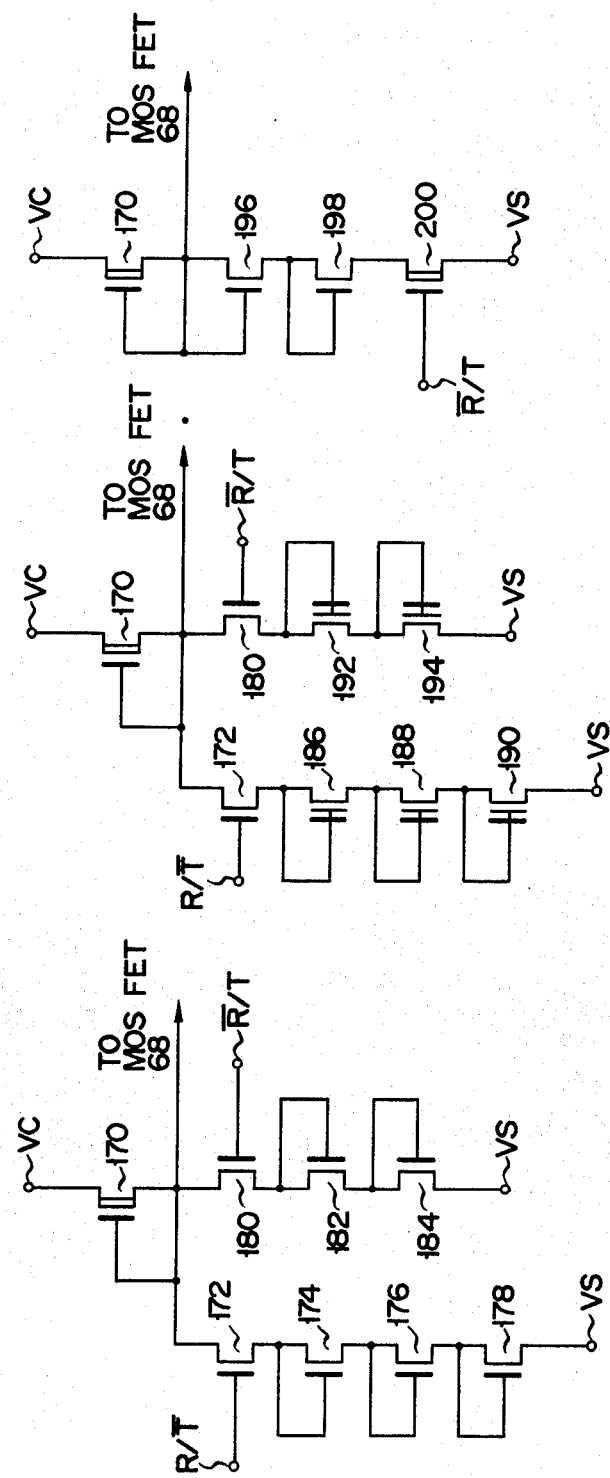

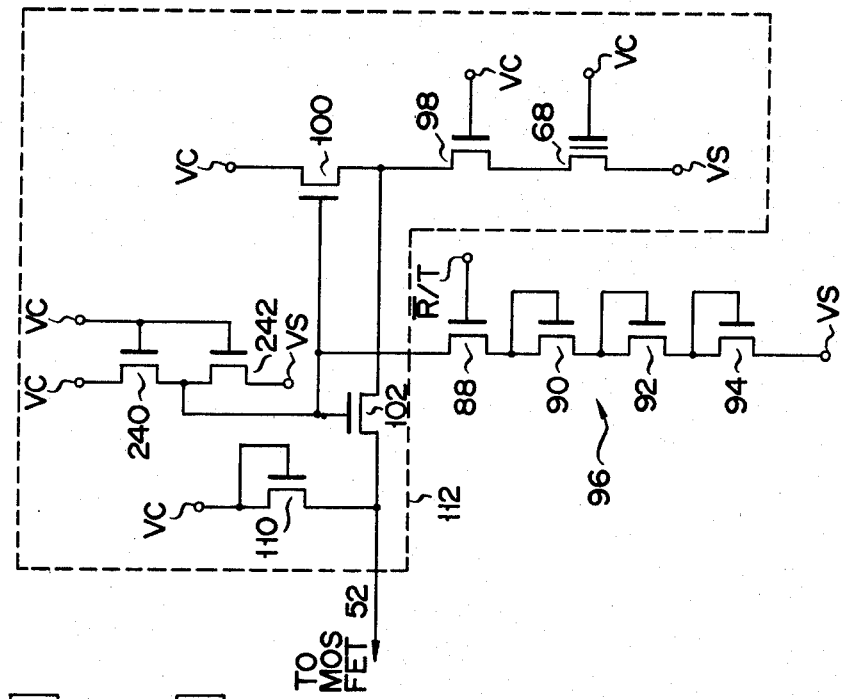
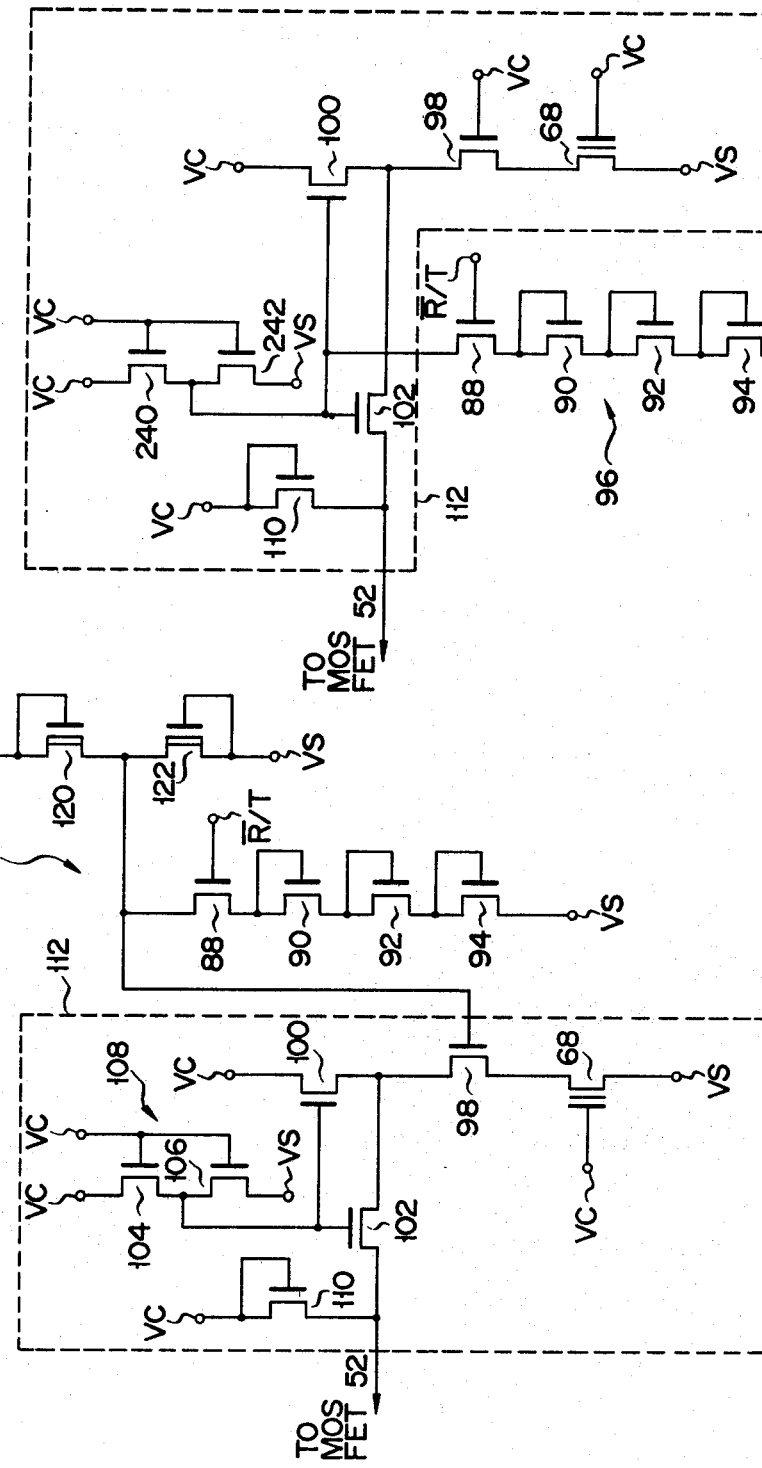
FIG. 8A
FIG. 7

F I G. 10B
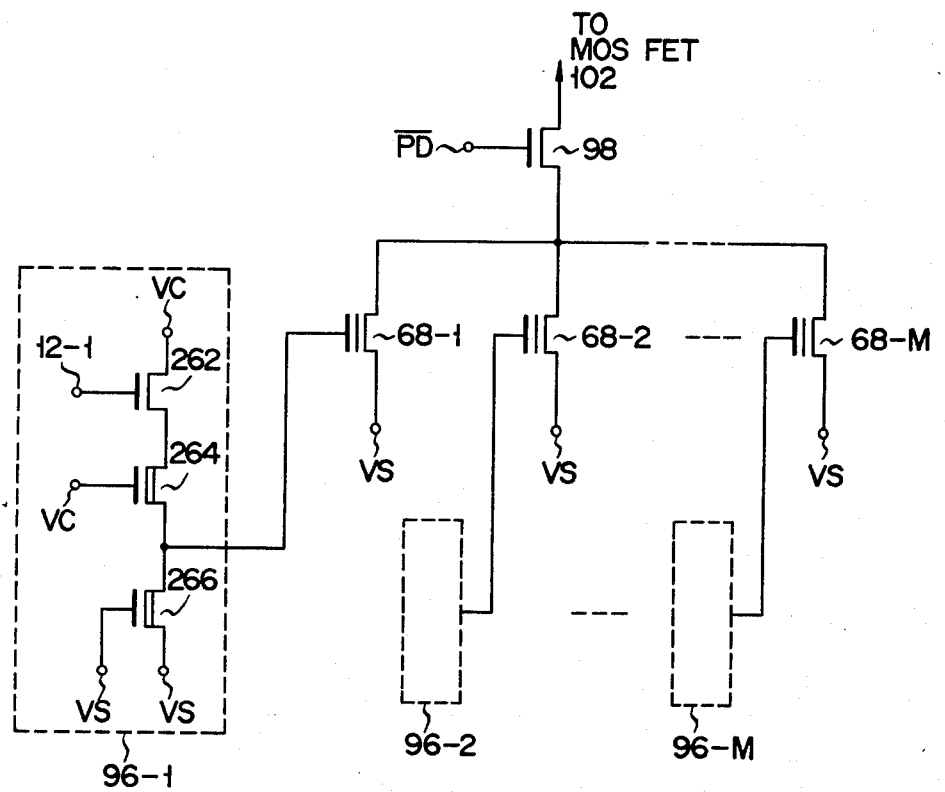

NONVOLATILE SEMICONDUCTOR MEMORY DEVICE

BACKGROUND OF THE INVENTION

This invention relates to a nonvolatile semiconductor memory device.

EPROMs including floating gate MOS FETs as memory cells are generally used as nonvolatile semiconductor memories. Data are written into the EPROM through the effect of injection of the electrons into the floating gate. These electrons which are separated from holes by impact ionization in a pinch-off region formed in the vicinity of the drain when a high voltage is applied to the drain and control gate of a floating gate MOS FET. FIG. 1 shows an example of a prior art EPROM. The output signal of a memory array 2 formed of floating gate MOS FETs 1 is supplied to an input terminal of a differential sense amplifier 4, while the output signal of a reference signal generator 6, including floating gate MOS FETs 5 with the same configuration of the MOS FETs 1 forming the memory array 2, is supplied to the other input terminal of the differential sense amplifier 4. A gate signal generator 8 is connected to the control gate of the MOS FETs 5 in the reference signal generator 6. The output signal of the differential sense amplifier 4 is read out by means of an output buffer (not shown), and used as data.

At the time of reading, a specified memory cell in the memory array 2 is selected. The state of conduction of the memory cell depends on whether or not the floating gate is injected with electrons. Thus, the output line of the memory array 2 is charged or discharged. The output level of the sense amplifier 4 depends on the difference between the level of the output line of the memory array 2 and the output level of the reference signal generator 6. If the output voltages of the memory array 2 and the reference signal generator 6 are VA and VB, respectively, the output level of the sense amplifier 4 is logic 1 level where VA>VB, and logic 0 level where VA<VB. If the gate voltage of the transistor 5 in the reference signal generator 6, i.e. the output voltage of the gate signal generator 8, is VR, VB is equal to VA corresponding to the gate voltage of the selected memory cell at VR when the memory cell is neutral, that is, when the floating gate is not injected with electrons.

If VR=0.6 VC is given by resistors between VC and VS in the gate signal generator 8, the gate potential of the selected memory cell is substantially equal to VC. If a neutral cell is selected, the relationship of VA<VB is established, so that the output level of the sense amplifier 4 becomes logic 0. If a written cell is selected, on the other hand, the relationship of VA>VB is established, so that the output level of the sense amplifier 4 becomes logic 1.

In order to check up the amount of data written in the memory cell, there will be investigated the minimum value of the threshold voltage of the memory cell whereby it is given as a conclusion that data is written in the memory cell. Since the MOS FET 5 for generating the reference signal is equivalent to the MOS FET 1 of the memory cell, a current flowing through both these MOS FETs is in proportion to the difference between the gate voltage and the threshold voltage. VA>VB may be obtained under the following condition:

$$VC - VTH < VR - VTH' \quad (1)$$

Here VTH and VTH' are the threshold voltages of the MOS FETs 1 and 5, respectively.

Substituting VR=0.6 VC into Expression (1), we obtain the following condition:

$$VTH > 0.4\ VC + VTH' \quad (2)$$

If VC=5.5 V and VTH'=1.5 V are given, the threshold voltage VTH of the memory cell is more than 3.7 V. Namely, data may be written in the memory cell at a voltage higher than 3.7 V as compared with the supply voltage of 5.5 V even if the MOS FET in the memory cell is not perfectly cutoff due to the electrons injected into the floating gate.

It is important, to check the memory cells of the EPROM for acceptablity, e.g. data holding capability before shipment. In a general test on an EPROM, the product is exposed to a high temperature after data is written, and then the threshold voltage VTH of the memory cell is detected. For this purpose, the supply voltage VC, i.e. the gate voltage of the memory cell, is changed, and a supply voltage VC' for the inversion of the state of the memory cell is detected. Suppose when the supply voltage VC' of the memory cell is 7 V, the memory data is inverted. The memory data is inverted when the supply voltage VC' is 6 V after high heating testing. Then, it may be given as a conclusion of high heating test that the electrons have slipped out of the floating gate, revealing defective insulation of the floating gate. Subsequently, as regards the EPROM of FIG. 1, the minimum value of the supply voltage VC to invert the output data is sought for. If the threshold voltage VTH of the memory cell is 5.5 V, VC is obtained by reversing the sign of inequality of Expression (2) as follows:

$$5.5 < 0.4\ VC + 1.5$$

$$VC > 10.0$$

Namely, the data is inverted when the supply voltage is higher than 10 V. The higher the threshold voltage VTH of the memory cell in which the data is written necessitates the higher the supply voltage. However, it is not advisable to apply such a high voltage to the memory because transistors in a circuit with 5 V power supply may possibly be broken. Thus, the EPROM of this type cannot be checked before shipment, leaving room for improvement in reliability.

Operations of a MOS FET may be classified by biasing conditions into two modes; saturated operation (pentode operation) and unsaturated operation (triode operation). These two modes of operation may be expressed, respectively, as follows:

$$VG - VTH - VS \leq VD - VS \quad (3)$$

$$VG - VTH - VS > VD - VS \quad (4)$$

VG is the control gate voltage; VD, drain voltage; VS, source voltage; and VTH, threshold voltage.

It is known that the pentode operation of the MOS FET would produce a pinch-off region. In the EPROM of FIG. 1, the gate voltage of the MOS FET 5 in the reference signal generator 6 is lower than VC, so that the operation of the MOS FET 5 resembles the pentode operation more than the operation of the memory cell does. Accordingly, electrons may possibly be accumulated gradually in the floating gate of the floating gate MOS FET 5 during prolonged use. As a result, the reference voltage of the differential sense amplifier 4 may be varied to change the speed of data reading from the memory array 2 or to cause wrong data decision. Thus, the reliability of the memory is lowered.

In other conventional ROMs than the EPROM, moreover, the data readout time depends on the charge and discharge time of the output line. As the memory capacity increases, therefore, the stray capacity of the output line increases to prolong the readout time.

SUMMARY OF THE INVENTION

An object of this invention is to provide a nonvolatile semiconductor memory device of high reliability.

Another object of the invention is to provide a nonvolatile semiconductor memory device capable of checking of memory cells for acceptability before shipment.

Still another object of the invention is to provide a nonvolatile semiconductor memory device free from wrong data decision in reading.

A further object of the invention is to provide a nonvolatile semiconductor memory device improved in reading speed.

In order to attain these objects, there is provided a nonvolatile semiconductor memory device comprising a memory array formed of nonvolatile semiconductor memory elements arranged in the form of a matrix, a reference signal generating circuit for generating first and second reference signals at the time of testing and at the time of reading, respectively, and a differential sense amplifier for producing a signal corresponding to the difference between the output signals of the memory array and the reference signal generating circuit.

BRIEF DESCRIPTION OF THE DRAWINGS

FIGS. 2A and 2B are circuit diagrams showing a first embodiment of the nonvolatile semiconductor memory device of this invention;

FIGS. 3A to 3I are circuit diagrams showing modifications of the first embodiment;

FIG. 7 is a circuit diagram showing a third embodiment of the nonvolatile semiconductor memory device of the invention;

FIGS. 10A and 10B are circuit diagrams showing modifications of the fourth embodiment;

DETAILED DESCRIPTION OF THE PREFERRED EMBODIMENTS

Figure 1:
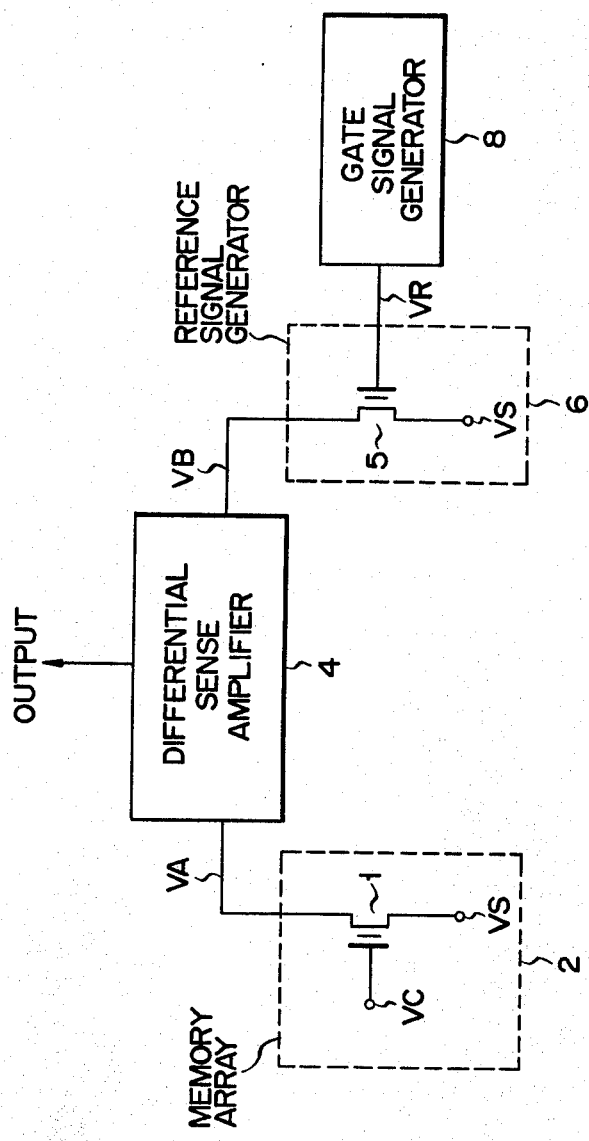
FIG. 1 is a circuit diagram of a prior art nonvolatile semiconductor memory.
Figure 2B:
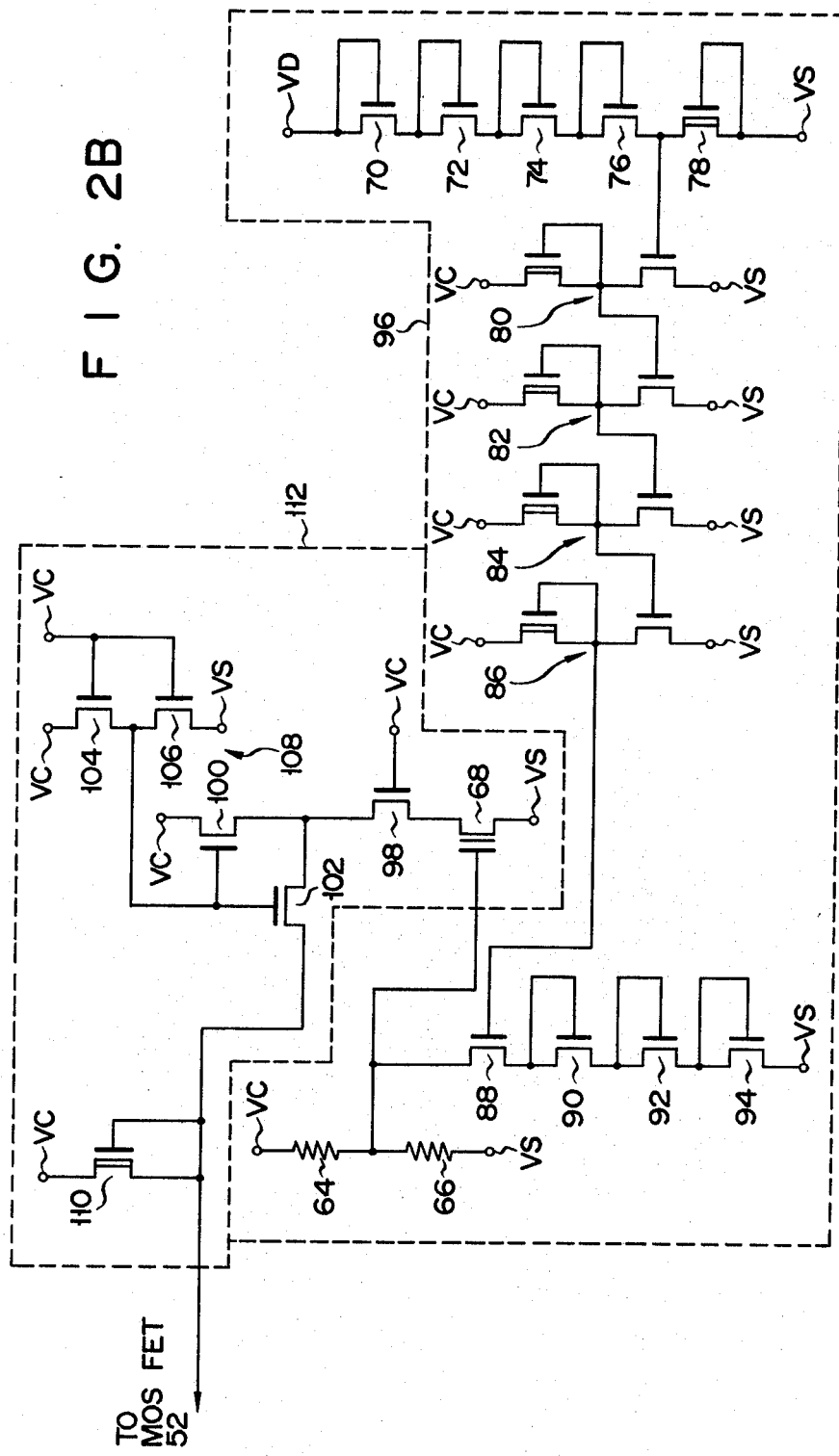

Now there will be described a nonvolatile semiconductor memory device according to an embodiment of this invention with reference to the accompanying drawings. FIGS. 2A and 2B are circuit diagrams of the embodiment. $M \times N$ number of floating gate MOS FETs 10-11, 10-12, . . . , 10-MN with their sources connected to an earth terminal VS as a first power supply terminal are arranged in the form of a matrix to form a memory array 10. The MOS FETs mentioned herein are enhancement type N-channel MOS FETs unless otherwise provided. The gates of MOS FETs in each of the rows are connected to a row decoder 12 by means of their corresponding row line. The drains of MOS FETs in individual columns are connected severally to the sources of column selection MOS FETs 14-1, 14-2, . . . , 14-N by means of their corresponding column lines. The gates of the MOS FETs 14-1, 14-2, . . . , 14-N are connected to a column decoder 16, and their drains are connected in common to a high voltage power supply terminal VP for writing through a writing MOS FET 18. The gate of the MOS FET 18 is connected to a writing terminal 20. The common drain of the MOS FETs 14-1, 14-2, . . . , 14-N, i.e. the output terminal of the memory array 10, is connected to a power supply circuit 38 formed of MOS FETs 30, 32, 34 and 36. The output terminal of the memory array 10 is connected to a first input terminal of a differential sense amplifier 40 and a depression type MOS FET (D MOS FET) 42 which serves as a load.

In the differential sense amplifier 40, a D MOS FET 44, a MOS FET 46, and a D MOS FET 48 are connected in series between a power supply terminal VC and the earth terminal VS, and a D MOS FET 50 and a MOS FET 52 are connected in series between the power supply terminal VC and the D MOS FET 48. Hereupon, the output signal of the memory array 10 is supplied to the gate of the MOS FET 46, while a reference signal as mentioned later is supplied to the gate of the MOS FET 52. The gate and source of the D MOS FET 44 are connected in common with the gate of a MOS FET 54. MOS FETs 54 and 56 are connected in series between the power supply terminal VC and the earth terminal VS. The gate and source of the D MOS FET 50 are connected in common with the gate of a MOS FET 58. MOS FETs 58 and 60 are connected in series between the power supply terminal VC and the earth terminal VS. The gates of the MOS FETs 56 and 60 are connected to the drains of the MOS FETs 60 and 56, respectively, and the drain of the MOS FET 60 is connected to an output terminal 62.

Meanwhile, the junction of resistors 64 and 66 connected in series between the power supply terminal VC and the earth terminal VS is connected to the control gate of a floating gate MOS FET 68 with the same configuration as that of the memory cell. MOS FETs 70, 72, 74 and 76 and D MOS FET 78 are connected in series between a power supply terminal VD and the earth terminal VS. The gates of the MOS FETs 70, 72, 74 and 76 are connected to their respective drains, and the gate of the D MOS FET 78 is connected to its source. The junction of the MOS FET 76 and D MOS FET 78 is connected to the gate of a MOS FET 88 through inverters 80, 82, 84 and 86. The source of the MOS FET 88 is connected to the earth terminal VS through MOS FETs 90, 92 and 94 connected in series, and the drain of the MOS FET 88 is connected to the control gate of the floating gate MOS FET 68. The gates of the MOS FETs 90, 92 and 94 are connected to those drains, respectively. Thus, these circuit elements constitute a gate signal generator 96 for the MOS FET 68.

The floating gate MOS FET 68 has its source grounded, and its drain connected to the source of a MOS FET 98 with the same configuration as that of the column selection MOS FET 14 of each memory cell. The MOS FET 98 has its gate connected to the power supply terminal VC, and its drain connected to a power supply circuit 108 formed of MOS FETs 100, 102, 104 and 106, and a MOS FET 110 as a load and the gate of the MOS FET 52 of the differential sense amplifier 40. The power supply circuit 108 and the load MOS FET 110 have the same configurations as those of the power supply circuit 38 and the load MOS FET 42 on the output side of the memory array 10, respectively. The floating gate MOS FET 68, the MOS FET 98, the power supply circuit 108, and the load 110 constitute a reference signal generator 112.

Now the operation of the aforementioned embodiment will be described in detail. Suppose a voltage of 20 V is applied to the high voltage power supply terminal VP. First, in writing operation, high voltage (20 V) or 0 V is applied to the writing terminal 20 in response to data "0" or "1", respectively. When the data is "0", one of the column lines is selected in accordance with the output signal of the column decoder 16, and one of the row lines is set to high voltage in accordance with the output signal of the row decoder 12. As a result, high voltage is applied to the gate and drain of only one of the MOS FETs 10, and electrons are injected into the floating gate of the MOS FET 10. When the data is "1", the MOS FET 18 is nonconductive. Since high voltage is not applied to the drain of the MOS FET 10, the floating gate of the memory cell is neutral.

When the data writing operation is ended in this manner, the writing terminal 20 is kept at 0 V. At the time of reading, as well as at the time of writing, one of the memory cells is selected by the row and column decoders 12 and 16. If the floating gate of the memory cell is neutral, the memory cell is rendered conductive, and the potential of the output line of the memory array 10 is lowered by discharge. If electrons are injected into the floating gate of the memory cell, on the other hand, the memory cell is nonconductive, and the potential of the output line of the memory array 10 is charged by the MOS FETs 30 and 42. Further, the MOS FET 42 augments the amplitude of the output potential of the memory array 10, and supplies the output potential to the first input terminal of the sense amplifier 40. The sense amplifier 40 compares the first input signal with the reference signal, and produces a logic 0 or logic 1 level signal if the level of the first input signal is lower or higher than the reference signal, respectively.

In the power supply circuit 38, the MOS FETs 30 and 32 are controlled in accordance with a given potential at the junction of the MOS FETs 34 and 36 connected in series between the power supply terminal VC and the earth terminal VS, and the drains of the MOS FETs 10-11, 10-12, . . . , 10-MN of the memory array 10 are kept at a potential lower than the supply voltage VC. This is done because if the drain voltage is higher than the supply voltage VC, the gate voltage reaches the supply voltage VC in reading to gradually charge the floating gate of the memory cell which should be kept neutral.

At the time of reading, a voltage lower than 5 V is applied to the power supply terminal VD. Therefore, the potential at the junction of the MOS FET 76 and D MOS FET 78 is about 0 V, the output level of the inverter 86 is logic 0, and the MOS FET 88 is nonconductive. Accordingly, the output voltage VR of the gate signal generator 96 to be supplied to the control gate of the MOS FET 68 takes a value obtained by dividing the supply voltage VC by the resistance value of the resistors 64 and 66, varying according to the supply voltage VC.

At the time of testing, a voltage of 25 V is applied to the power supply terminal VD, so that the output level of the inverter 86 is logic 1, and the MOS FET 88 is conductive. Accordingly, the gate voltage VR is equal to the sum of the threshold voltages of the MOS FETs 90, 92 and 94, and is kept at a fixed value although the power supply voltage VC is varied. Thereupon, where the gate voltage VR is constant irrespectively of the supply voltage VC, the lowest necessary value of the supply voltage VC to invert the data of the memory cell whose floating gate is charged by electrons is sought for. Assuming VR=3 V, the voltage VC is obtained by reversing the sign of inequality of Expression (1). Here VTH=5.5 V and VTH'=1.5 V of the memory cell.

$$VC - 5.5 > 3 - 1.5$$

$$VC > 7.0$$

If VR=2 V is given, then VC>6.0. Thus, the lower the gate voltage VR, the lower the supply voltage VC required will be. In testing, the data is inverted with VC>6 V when VR=2 V and VTH=5.5 V. If VTH is reduced to 4.5 V after various tests on reliability, the data are inverted with VC>5.5 V. This indicates some defect in the memory. In this case, the supply voltage applied need be as low as 6 V as compared with 10 V for the prior art case. This is so because the gate voltage VR is constant at the time of testing.

Now let us consider the voltage VB of the reference signal of the sense amplifier 40, that is, the output signal of the reference signal generator 112. At the time of testing, the gate voltage VR is constant. Therefore, the conductive resistances of the MOS FETs 100 and 110 are reduced as the supply voltage VC increases, so that the reference voltage VB increases. At the time of normal reading, however, the gate voltage VR increases with the rise of the supply voltage VC since the MOS FET 88 is cutoff. Accordingly, the conductive resistance of the floating gate MOS FET 68 is reduced as the supply voltage VC increases, and the increasing rate of the reference voltage VB is reduced by the decrement of the conductive resistance as compared with the value for testing. Thus, the dependence of the reference voltage VB on the supply voltage VC is higher at the time of testing than at the time of normal reading. In other words, the defective memory array can be detected during testing by making the ratio of the increase of the reference voltage VB to the increase of the supply voltage VC for testing higher than the ratio for reading.

According to the above-mentioned embodiment, written data can be checked out before shipment, so that there may be provided a high reliability nonvolatile semiconductor memory.

The reason why at the time of testing and at the normal reading time a circuit comprising transistors 70, 72,

74, 76 and 78 and inverters 80, 82, 84 and 86 is used to switch a gate voltage VR is as follows: In order to effect switching to the testing or the normal reading it is necessary to provide such a signal that it is, for example, a logic 1 at the time of testing and, for example, a logic 0 at the normal reading time. Such a signal must be supplied from the outside and, to this end, it will be necessary to provide a package including a memory formed on an integrated circuit as well as bonding pads on the integrated circuit which are connected to input the above-mentioned signal. Since, however, the bonding pads occupy a considerably great area (for example, a square area with each side of 100 μm), it is undesirable in the light of the chip size to provide the bonding pads for the testing purpose only (the test is performed at the delivery of the devices and the user in particular perform no such testing). This increases the number of external connection pins of the package, making the package larger in size. FIG. 2B is a circuit comprised of the transistors 70, 72, 74, 76 and 78 and inverters 80, 82, 84 and 86, where an input terminal for the above-mentioned signal for effecting switching to the testing or to the normal reading and for other signals such as chip enable signal is used as a common input terminal. That is, the terminal VD is connected to, for example, a chip enable signal terminal. The chip enable signal is supplied through an input circuit where an input is, for example, a logic 0 level at 0 V and, for example, a logic 1 level at above 5 V. The switching circuit includes a signal generator for producing a signal of logic 0 when the terminal VD is at below 25 V and a signal of logic 1 when the terminal VD is at above 25 V.

The chip enable signal is used normally in a range of 0 to 5 V and, at the time of testing, has a value of 25 V for switching. Thus, one terminal can be used for the two purposes. At the time of normal reading, since the sum of the threshold voltages of the transistors 70, 72, 74 and 76 is set at above 5 V, there is no current through the transistors 70, 72, 74 and 76 and a potential on a junction of the transistors 76 and 78 is at the zero level and the output of the inverter 86 is a logic 0 level i.e. at the zero level. At the time of testing the terminal VD (the chip enable terminal) is at the level of 25 V and the transistors 70, 72, 74 and 76 are rendered conductive and a potential on a junction of the transistors 76 and 78 is raised up to a level at which the inverter 80 detects the logic 1 level. The output of the inverter 86 becomes a logic 1 level (VC). The use of such a circuit permits the use of one common terminal for the two purposes. The terminal VD may be connected directly to the inverter 80. At this time, the inverter 80 judges a logic 0 level at less than 10 V and a logic 1 level at above 10 V. In order to perform such an operation a β ratio of a transistor for driving a load transistor, which constitutes the inverter 80 is changed or the threshold voltage of the drive transistor may be brought to, for example, around 10 V.

Now there will be given several modifications of this embodiment. In the description to follow, same reference numerals used in the description of the first embodiment refer to like portions. FIGS. 3A to 3I show first to ninth modifications related to the gate signal generator 96 of the first embodiment which produces different gate voltages VR for testing and reading. In these drawings, the output terminal of the inverter 86 with different output levels for reading and testing is designated by R/T for simplicity. In the first to third modifications shown in FIGS. 3A to 3C, depression-type MOS FETs 120 and 122 are used in place of the resistors 64 and 66, respectively, shown in FIG. 2B. In the first modification of FIG. 3A, the gates of the D MOS FETs 120 and 122 are connected to their respective sources. In the second modification of FIG. 3B, the gate of the D MOS FET 120 is connected to its drain, while the gate of the D MOS FET 122 is connected to its source. In the third modification of FIG. 3C, the gates of the D MOS FETs 120 and 122 are connected to their respective drains.

In the fourth modification shown in FIG. 3D, the junction of a D MOS FET 130 and MOS FET 132 connected in series between the power supply terminal VC and the earth terminal VS is connected to the gate of a D MOS FET 134 which is connected in series with a D MOS FET 136 between the terminals VC and VS. The gate and source of the D MOS FET 136 are con- The gate and source of the D MOS FET 136 are connected each other. The R/T terminal, whose of reading and at the time of testing, respectively, is connected to the gate of the MOS FET 132, and the junction of the D MOS FETs 134 and 136 is connected to the control gate of the MOS FET 68.

At the time of reading, the MOS FET 132 is rendered nonconductive, and the gate of the D MOS FET 134 is supplied with the supply voltage VC through the D MOS FET 130, so that the voltage VR at the junction of the D MOS FETs 134 and 136 becomes lower than VC by a predetermined level. At the time of testing, the gate voltage of the D MOS FET 134 is reduced to 0 V by allowing the MOS FET 132 to be conductive. As a result, the voltage VR at the junction of the D MOS FETs 134 and 136 is lower than the threshold voltage VTH(134) of the D MOS FET 134 by a voltage β which is diverged to the earth terminal VS through the D MOS FET 136. Thus, the voltage VR is given by $VR = \not\neq VTH(134) \not\neq -\beta$, and can be kept substantially constant irrespectively of the supply voltage VC.

FIG. 3E shows the fifth modification, in which D MOS FETs 140 and 142 are connected in series between the power supply terminal VC and the earth terminal VS, and MOS FETs 144 and 146 are connected between the gate and source of the D MOS FET 140 and between the gate of the D MOS FET 140 and the earth terminal VS, respectively. The R/T terminal is connected to the gate of the MOS FET 146, while an R/T terminal, which attains logic 1 (VC) and logic 0 (0 V) levels at the time of reading and at the time of testing, respectively, is connected to the gate of the MOS FET 144. The junction of the D MOS FETs 140 and 142 is connected to the gate of the MOS FET 68.

At the time of reading, the MOS FETs 144 and 146 are conductive and nonconductive, respectively. Therefore, the gate voltage VR of the MOS FET 68 takes a value obtained by dividing the supply voltage VC in accordance with the conductive resistances of the MOS FETs 140 and 142. At the time of testing, the MOS FETs 144 and 146 are nonconductive and conductive, respectively, so that the gate voltage of the D MOS FET 140 becomes 0 V. Thus, the same operation as in the fourth modification is performed.

In the sixth modification shown in FIG. 3F, a D MOS FET 150 and a MOS FET 152 are connected in series between the power supply terminal VC and the earth terminal VS. The gate of the D MOS FET 150 is connected to its source and the gate of a D MOS FET 154, while the gate of the MOS FET 152 is connected to the R/T terminal. The D MOS FET 154 has its drain connected to the power supply terminal VC, and its source connected to the earth terminal VS through a MOS FET 156. The gate of the MOS FET 156 is connected to its drain and the gate of a D MOS FET 158. The drain and source of the D MOS FET 158 are connected to the power supply terminal VC and grounded through a D MOS FET 160, respectively. The gate and drain of the D MOS FET 160 are connected to its source and the gate of the MOS FET 68, respectively.

In such an arrangement, the MOS FET 152 is nonconductive at the time of reading, so that the voltage level at the junction of the D MOS FET 150 and MOS FET 152 is at logic 1 (VC). Since the conductive resistance of the D MOS FET 154 is reduced, the potential at the junction of the D MOS FET 154 and MOS FET 156 rises to be around the supply voltage VC. Accordingly, the gate voltage VR of the MOS FET 68, as well as the gate voltage of the D MOS FET 158, becomes lower than the supply voltage VC by a fixed value.

At the time of testing, the MOS FET 152 is conductive, so that the gate voltage of the D MOS FET 154 is reduced to logic 0 (VS) voltage. Accordingly, the gate voltage of the D MOS FET 158 reaches the threshold voltage of the MOS FET 156. As a result, the gate voltage VR of the MOS FET 68 takes a fixed value which is lower than the sum of the absolute value of the threshold voltage of the D MOS FET 158 and the threshold voltage of the MOS FET 156 by the value of a voltage diverged to the earth terminal VS by the D MOS FET 160.

Although the gate voltage VR, at the time of reading, is variable according to the supply voltage VC in the above-mentioned modifications, it may take a substantially fixed value just as at the time of testing. In the modifications described hereinafter, the gate voltage VR at the time of reading is set at a fixed value.

FIG. 3G shows the seventh modification, in which a D MOS FET 170 is connected between the power supply terminal VC and the gate of the MOS FET 68, the gate of the D MOS FET 170 being connected to the gate of the MOS FET 68. A series circuit of MOS FETS 172, 174, 176 and 178 and a series circuit of MOS FETs 180, 182 and 184 are connected between the gate of the MOS FET 68 and the earth terminal VS. The gate of the MOS FET 172 is connected to the R/T terminal, while the gates of the MOS FETs 174, 176 and 178 are connected to their respective drains. The gate of the MOS FET 180 is connected to the R/T terminal, while the gates of the MOS FETs 182 and 184 are connected to their respective drains.

In this modification, the MOS FETs 172 and 180, at the time of reading, rendered conductive and nonconductive, respectively, so that the gate voltage VR is the sum of the respective threshold voltages of the MOS FETs 174, 176 and 178. At the time of testing, on the other hand, the MOS FETs 172 and 180 are nonconductive and conductive, respectively, so that the gate voltage VR is the sum of the respective threshold voltages of the MOS FETs 182 and 184. Thus, in this modification, the gate voltage depends not on the supply voltage VC but on the threshold voltages of the MOS FETs both at the time of testing and at the time of normal reading.

Here, the gate voltage VR is set higher at the reading time than at the time of testing. This has the following meaning. With the memory cell in the written state Expression (1) is satisfied and reduced to the form:

$$VTH > VC - VR + VTH'$$

That is, the written state is judged if the threshold voltage of the memory cell becomes a level of VTH at which this expression is satisfied. As evident from this expression, the higher the voltage VR, the smaller the voltage VTH. That is, the variation of the voltage VTH, i.e., an amount of write-in information to the memory can be made smaller.

At the time of testing, if the voltage VR is smaller as set out above, the data of the memory cell is inverted with a smaller level of the power supply voltage VC. In consequence, if the voltage VR is made smaller at the time of testing, the value of the voltage VC can be made smaller.

In this way, at the normal reading time the voltage VR is made higher and an amount of information write-in to the memory cell can be made smaller, while at the time of testing the voltage VR is set lower and the voltage VC upon data inversion in the memory cell can be made smaller. This permits the test to be made readily and assures a stable operation of the circuit.

Figure 4:
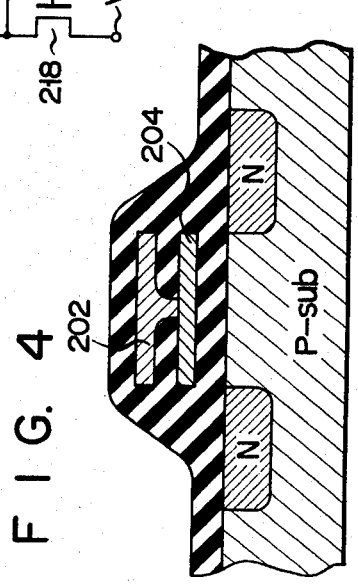
FIG. 4 is a sectional view showing an arrangement of a MOS FET used in the modification shown in FIG. 3H.

In the eighth modification shown in FIG. 3H, the MOS FETs 174, 176, 178, 182 and 184 of FIG. 3G are replaced with MOS FETs 186, 188, 190, 192 and 194, respectively, each composed of a floating gate MOS FET with the same configuration of the memory cell provided that a floating gate 204 and a control gate 202 are connected each other, as shown in FIG. 4.

In such an arrangement, the threshold voltages of the MOS FETs 186, 188, 190, 192 and 194 each correspond to the threshold voltage of the memory cell at a ratio of 1:1. The difference between the gate voltage VR of the MOS FET 68 and the threshold voltage VTH' of the MOS FET 68 is not affected by the threshold voltages of the other transistors and substantially kept constant.

Hereupon, the MOS FETs 186, 188 and 190 which produce the gate voltage VR in normal reading may alternatively be conventional enhancement type MOS FETs. It is to be understood that, in the seventh and eighth modifications, the number of MOS FETs connected in series between the control gate of the MOS FET 68 and the earth terminal VS is set in accordance with the desired gate voltage VR.

FIG. 3I shows the ninth modification, in which MOS FETs 196 and 198 and a D MOS FET 200 are connected in series between the gate of the MOS FET 68 and the earth terminal VS. The gates of the MOS FETs 196 and 198 are connected to their respective drains, while the gate of the D MOS FET 200 is connected to the R/T terminal.

In this modification, the conductive resistance of the D MOS FET 200 is small at the time of testing, so that the gate voltage VR is the sum of the threshold voltages of the MOS FETs 196 and 198. At the time of normal reading, the conductive resistance of the D MOS FET 200 is large, so that the gate voltage VR may be set at a higher value than the value at the time of testing.

Figure 5:
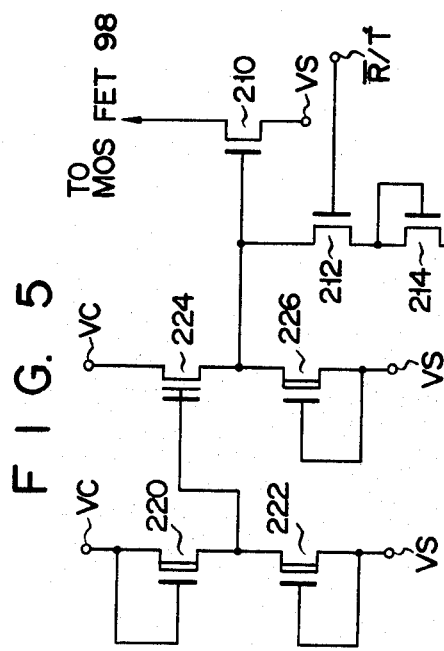
FIG. 5 is a circuit diagram showing a second embodiment of the nonvolatile semiconductor memory device of the invention.

Now there will be described a second embodiment of this invention. In the first embodiment, the floating gate MOS FET 68 with the same configuration of the memory cell is used for setting the reference signal of the differential sense amplifier 40, and the gate voltage VR of the MOS FET 68 is lower than the supply voltage VC. In the memory array 10, on the other hand, the selected row line is set at the supply voltage VC. The supply voltage VC is applied to the gate of the memory cell only when it is selected, whereas a voltage is continually applied to the control gate of the MOS FET 68. As a result, there is a fear of the MOS FET 68 performing pentode operation. Thus, it is not advisable to use the same floating gate MOS FET of the memory cell for the setting. Accordingly, in the second embodiment as shown in FIG. 5, a conventional MOS FET 210 is used instead of the floating gate MOS FET 68 in the reference signal generator 112 of the first embodiment shown in FIG. 2B. The drain and source of the MOS FET 210 are connected to the source of the MOS FET 98 (FIG. 2B) and the earth terminal VS, respectively. The gate of the MOS FET 210 is connected to the earth terminal VS through series-connected MOS FETs 212, 214, 216 and 218. The gate of the MOS FET 212 is connected to the $\overline{R/T}$ terminal, and the gates of the MOS FETs 214, 216 and 218 are connected to their respective drains. On the other hand, D MOS FETs 220 and 222 are connected in series between the power supply terminal VC and the earth terminal VS. The gate of the D MOS FET 220 is connected to its drain, while the gate of the D MOS FET 222 is connected to its source. The junction of the D MOS FETs 220 and 222 is connected to the gate of a MOS FET 224. The MOS FET 224 is a floating gate MOS FET equivalent to the memory cell, provided that the control gate 202 and the floating gate 204 are connected each other, as shown in FIG. 4. The MOS FET 224 has its drain connected to the power supply terminal VC, and its source connected to the gate of the MOS FET 210 and grounded through a D MOS FET 226.

Now there will be described the operation of the second embodiment. At the time of testing, the MOS FET 212 is rendered conductive, so that the gate voltage VR of the MOS FET 210 becomes equal to the sum of the respective threshold voltages of the MOS FETs 214, 216 and 218, and is constant. At the time of reading, the MOS FET 212 is rendered nonconductive, and the voltage at the junction of the D MOS FETs 220 and 222 is lower than a voltage obtained by dividing the supply voltage VC by the conductive resistances of the D MOS FETs 220 and 222. If the voltage at the junction, the threshold voltage of the MOS FET 224, and a voltage drop caused by the D MOS FET 226 are VX, VTH(224) and α, respectively, the gate voltage VR is given as follows:

$$VR = VX - VTH(224) - \alpha$$

Hereupon, the threshold voltage of the MOS FET 224 corresponds to that of the memory cell at a ratio of 1:1, so that the gate voltage VR depends on the threshold voltage of the memory cell; the higher the threshold voltage, the lower the gate voltage VR is, and vice versa. If the threshold voltage of the memory cell increases, the memory cell current is decreased, so that the discharge speed of the output signal line of the memory array 10 is reduced. At the same time, the gate voltage VR is lowered, so that the conductive resistance of the MOS FET 210 is increased to raise the output voltage VB of the reference signal generator 112. Namely, despite the increase in the conductive resistance of the memory cell and the reduction in the discharge speed of the output signal line, the access time never changes because the reference level VB of the sense amplifier 40 rises.

Thus, according to the second embodiment, the reference signal generator 112 can improve the reliability of the memory without the floating gate MOS FET. Instead of using the MOS FET 210, moreover, there may be used a MOS FET in which the floating gate and control gate are connected with each other, as shown in FIG. 4. By doing this, the change of the threshold voltage appeared in the gate voltage VR may be magnified.

Figure 6A:
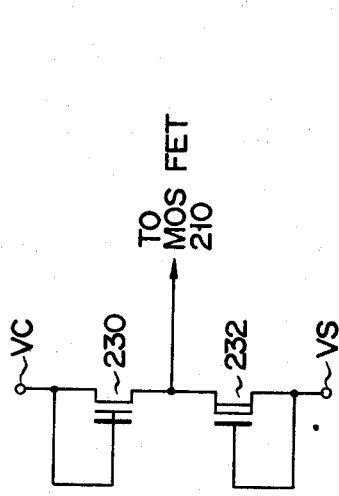
FIGS. 6A and 6B are circuit diagrams showing modifications of the second embodiment.
Figure 6B:
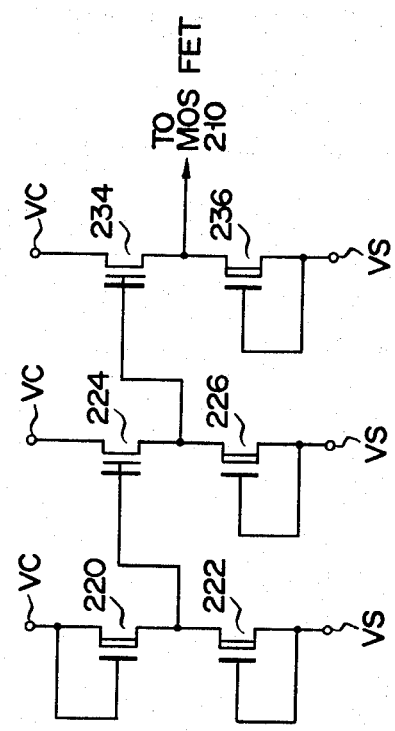

FIGS. 6A and 6B show first and second modifications of the second embodiment which are related to the portion to produce the gate voltage VR at the time of reading. In the first modification shown in FIG. 6A, a MOS FET 230 and D MOS FET 232 are connected in series between the power supply terminal VC and the earth terminal VS, and the junction of these two FETs is connected to the gate of the MOS FET 210. The MOS FET 230 has the same configuration of the memory cell, provided that the floating gate and control gate of the MOS FET 230 are connected with each other.

In this first modification, if the threshold voltage of the MOS FET 230 and a voltage drop caused by the D MOS FET 232 are VTH(230) and β, respectively, the gate voltage VR is given as follows:

$$VR = VC - VTH(230) - \beta$$

Namely, at the time of reading, the gate voltage VR of the MOS FET 210 changes according to the change of the threshold voltage of the MOS FET 230, i.e. the memory cell.

The second modification shown in FIG. 6B includes a MOS FET 234 and D MOS FET 236 connected in series between the power supply terminal VC and the earth terminal VS, as well as the arrangement shown in FIG. 5. The MOS FET 234 also have the same configuration of the memory cell, provided that the floating gate and control gate of the MOS FET 234 are connected with each other. The junction of the MOS FET 234 and the D MOS FET 236 is connected to the gate of the MOS FET 210. Thus, the change of the threshold voltage of the memory cell appeared in the gate voltage VR may be magnified.

Referring now to FIG. 7, there will be described a third embodiment of this invention. Here, a MOS FET 110 is shown, unlike the FIG. 2 arrangement, as an enhancement type and provided in a manner to correspond to the MOS FET 42 (FIG. 2A) on the side of the memory array 10. It is desirable that the MOS FET 110 be the same type as that of the MOS FET 42. The reason why in FIG. 7 the MOS FET 110 is shown as the enhancement type is because it is not restricted to the depletion type only i.e. because, if the transistor on the memory cell array side is the enhancement type, it is advisable that the MOS FET 110 be of the corresponding enhancement type. The transistor 42 in the circuit provided for the arrangement of FIG. 7 and corresponding to the arrangement of FIG. 2A (the circuit is not shown) should be of the enhancement type. The transistor 42 has its gate connected to the drain thereof. If the arrangement of FIG. 7 is combined with the arrangement of FIG. 2A, the transistor 110 in FIG. 7 is, of course, of the depletion type and has its gate connected to the source thereof. In this third embodiment, the bias of the floating gate MOS FET 68 in the reference signal generator 112, having the same configuration of the memory cell, is set so that triode operation may be performed without fail, and the reference voltage is substantially intermediate between the voltages represented by the data "0" and "1" delivered from the memory array 10. Namely, the reference voltage is set by connecting the control gate of the MOS FET 68 to the power supply terminal VC and controlling the gate voltage of the MOS FET 98 which, connected in series with the MOS FET 68, is equivalent to each column selection MOS FET 14 of the memory array 10. The gate voltage generating section used in this embodiment is identical with the one shown in FIG. 3B. According to this embodiment, the MOS FET 68 can accomplish entire triode operation, and the reference voltage VB of the sense amplifier 40 can suitably be set.

Figure 8:
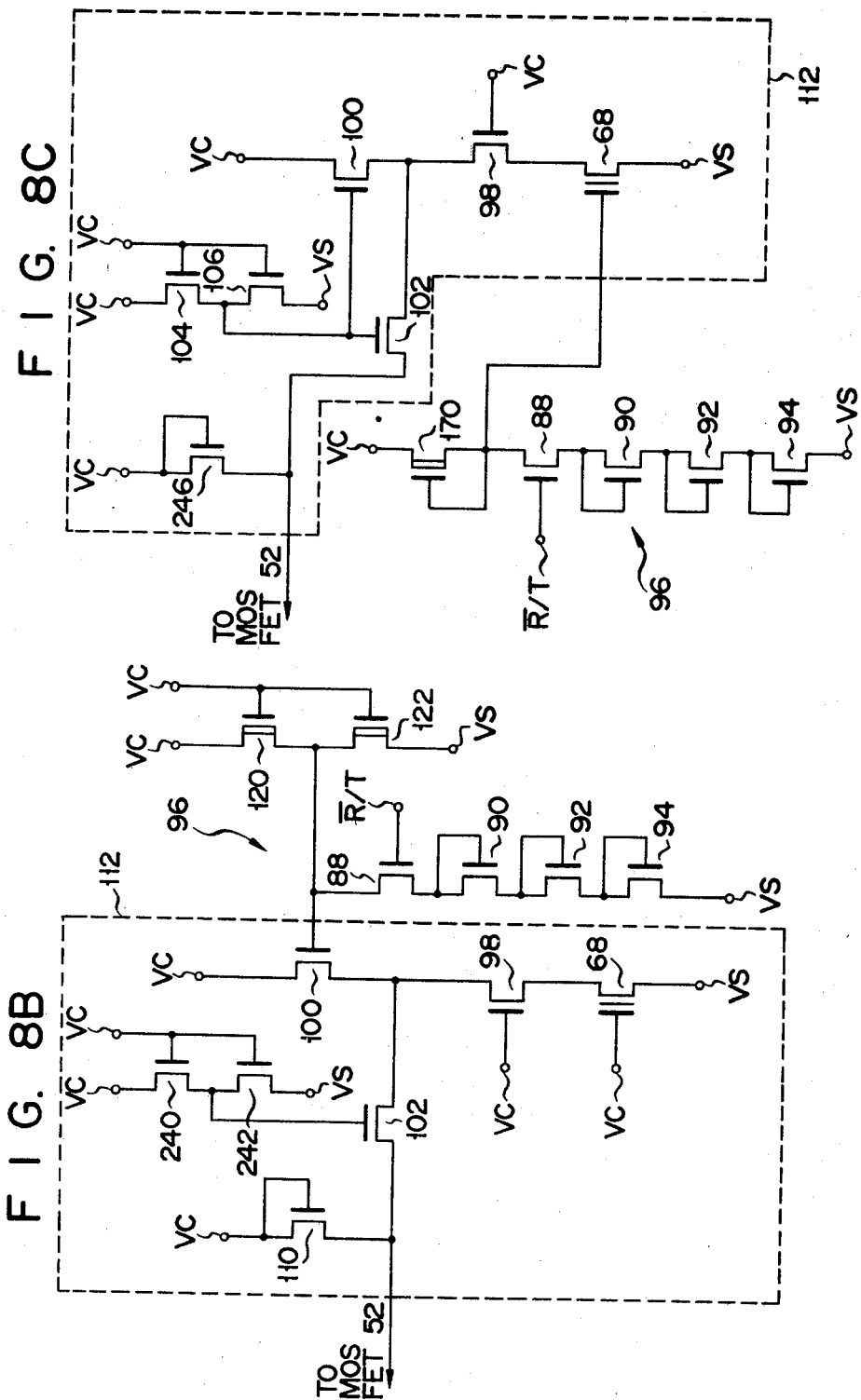
FIGS. 8A to 8C are circuit diagrams showing modifications of the third embodiment.

Referring now to FIGS. 8A to 8C, there will be described modifications of the third embodiment. The reason why the enhancement type MOS FET 110 is used is the same as above. In the modification shown in FIG. 8A, the gates of the MOS FETs 68 and 98 are connected to the power supply terminal VC, however, the gate voltages of the MOS FETs 100 and 102 are lower than those of the embodiment of FIG. 7. Connected in series between the power supply terminal VC and the earth terminal VS, therefore, are MOS FETs 240 and 242 whose gates are connected to the power supply terminal VC and whose gm ratio is different from that of the MOS FETs 104 and 106 of FIG. 7. The junction of the MOS FETs 240 and 242 is connected to the gate of the MOS FETs 100 and 102. Also, the series circuit of the MOS FETs 88, 90, 92 and 94, which produces the gate voltage for testing, is connected to the gates of the MOS FETs 100 and 102.

In order to set the reference voltage of the sense amplifier 40, it is necessary only that the gate voltage of the MOS FET 102 be set low. FIG. 8B shows a modification for such case. In this modification, the junction of the MOS FETs 240 and 242 is connected to the gate of the MOS FET 102. The gates of the D MOS FETs 120 and 122 in the gate signal generator 96 are connected to the power supply terminal VC and the output terminal of the gate signal generator 96 is connected to the gate of the MOS FET 100. In this modification, the D MOS FETs 120 and 122 may be of enhancement type.

In the modification shown in FIG. 8C, the gate of the MOS FET 98 is connected to the power supply terminal VC, and a MOS FET 246 with lower conductive resistance is used in place of the MOS FET 110 on the output side. The gate of the MOS FET 68 is connected to the output terminal of the gate signal generator 96 including a D MOS FET 170 and MOS FETs 88, 90, 92, 94 connected in series between the power supply terminal VC and earth terminal VS.

In this modification, the reference voltage VB can be set to a proper level higher than the reference voltage level obtained with use of the MOS FET 110.

Figure 9:
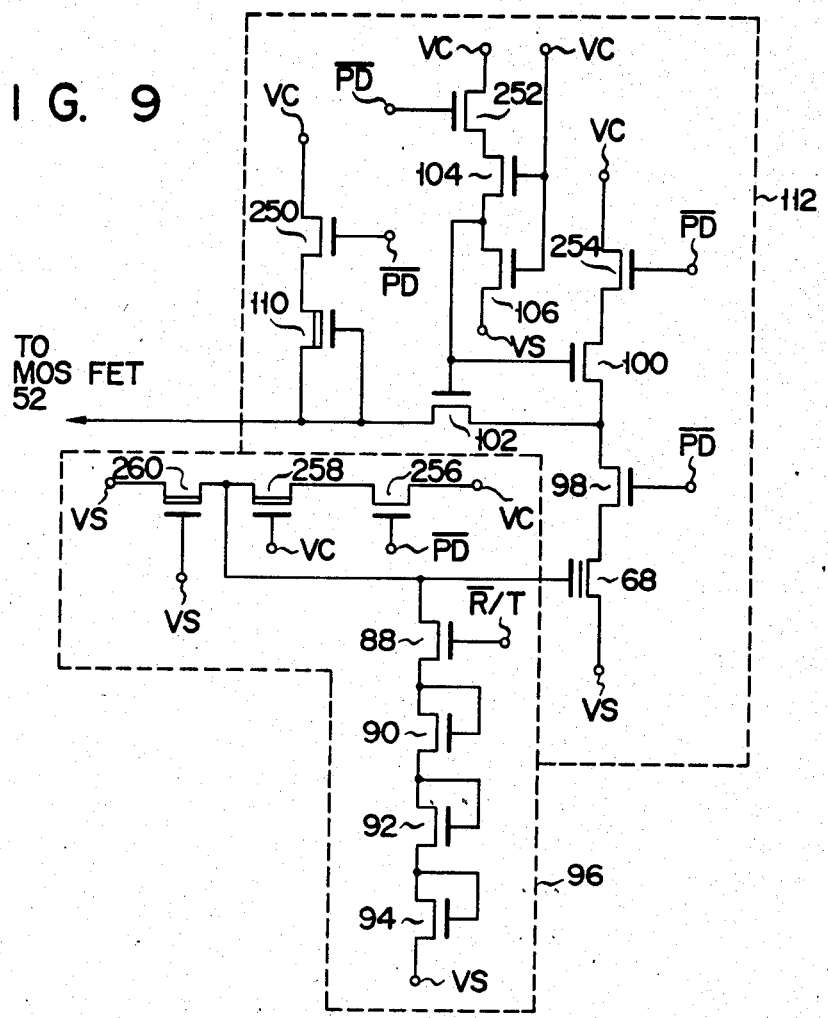
FIG. 9 is a circuit diagram showing a fourth embodiment of the nonvolatile semiconductor memory device of the invention.

FIG. 9 shows the principal part, i.e. the gate signal generator 96 and reference signal generator 112, of a fourth embodiment of this invention. This embodiment differs from the first embodiment shown in FIG. 2B in that MOS FETs 250, 252 and 254 are connected between the MOS FET 110 and the power supply terminal VC, between the MOS FET 104 and the power supply terminal VC, and between the MOS FET 100 and the power supply terminal VC, respectively, the gates of these MOS FETs 250, 252 and 254 being connected to a power down terminal PD whose output level is set to logic 0 (almost 0 V) in a power down mode. Further, the gate of the MOS FET 98 is connected to the power down terminal $\overline{PD}$, and a MOS FET 256 and D MOS FETs 258 and 260 are connected in series between the power supply terminal VC and the earth terminal VS. The junction between the D MOS FETs 258 and 260 is connected to the control gate of the floating gate MOS FET 68. The gates of the MOS FET 256 and D MOS FETs 258 and 260 are connected to the power down terminal $\overline{PD}$, the power supply terminal VC, and the earth terminal VS, respectively.

In order to reduce current consumption, memories of these days are set to the power down mode when they are not in operation. In this embodiment, thereupon, the power down terminal $\overline{PD}$ prevents a voltage from being applied to the gate of the floating gate MOS FET 68 in the power down mode. Thus, the stress on the MOS FET 68 may be reduced. In this embodiment, moreover, current consumption in the reference signal generator 112 can be reduced to zero in the power down mode.

The reference signal generator 112 need not always be provided with the MOS FETs 250, 252 and 254. At least it is unnecessary to use all of the MOS FETs 250, 252 and 254. It is desirable that the transistors whose gates are connected to the $\overline{PD}$ terminal have the threshold voltage of 0 V in the light of the power supply margin and the complete cutoff of the transistors.

Figure 10A:
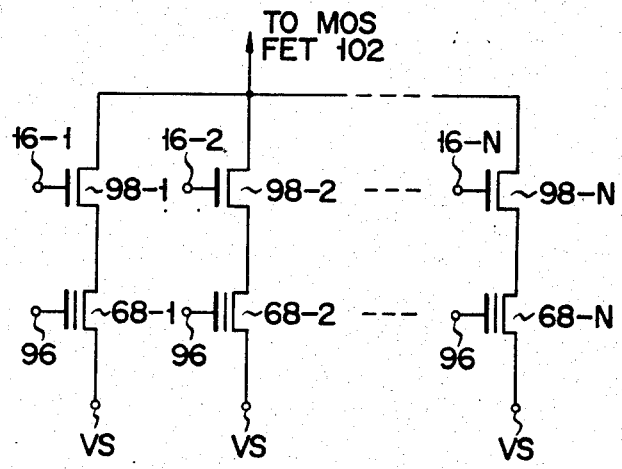

FIGS. 10A and 10B show modifications of the fourth embodiment. In the modification of FIG. 10A, the floating gate MOS FETs 68 and the MOS FETs 98, for example, as many as the columns of the memory array 10 are arranged, output terminals 16-1, 16-2, ..., 16-N of the column decoder 16 are connected to the gates of the MOS FETs 98-1, 98-2, ..., 98-N, respectively, and the output terminal of the gate signal generator 96 is connected to the gates of the MOS FETs 68-1, 68-2, ..., 68-N.

According to this modification, therefore, a voltage is applied to the drain of a MOS FET 68 only when a column corresponding to the MOS FET 68 is selected, so that the stress on the MOS FET 68 may greatly be reduced.

Instead of using the output signal of the column decoder 16, a column address signal may be utilized. In case, although the parallel-connected floating gate MOS FETs 68 may be reduced in number, the stress on each MOS FET 68 will thereby be increased.

In the modification shown in FIG. 10B, on the other hand, the MOS FETs 68 and the gate signal generators 96 as many as the rows of the memory array 10 are arranged so that the output terminals of the gate signal generators 96-1, 96-2, ..., 96-M are connected to the gates of the MOS FETs 68-1, 68-2, ..., 68-M, respectively. Each gate signal generator 96 is formed of a MOS FET 262 and D MOS FETs 264 and 266 connected in series between the power supply terminal VC and the earth terminal VS. The gates of the MOS FET 262 and the D MOS FETs 264 and 266 are connected to an output terminal 12-i of the row decoder 12, the power supply terminal VC, and the earth terminal VS, respectively. The MOS FETs 68-1, 68-2, ..., 68-M are connected in common to the MOS FET 98 at drains. The gate of the MOS FET 98 is connected to the power down terminal $\overline{PD}$. In the gate signal generator 96 of FIG. 10B, the MOS FETs 88, 90, 92 and 94 for producing the gate signal for testing are omitted.

In this modification, the output voltages of the gate signal generators 96 corresponding to unselected rows, that is, connected to logic 0 level output terminals of the row decoder 12, are at zero level, and only the gate signal generator 96 corresponding to the selected row is allowed to supply a given voltage to the gate of its corresponding MOS FET 68. Thus, the stress on each MOS FET 68 may be reduced. The gate of the MOS FET 98 may alternatively be connected to the power supply terminal VC.

Figure 11:
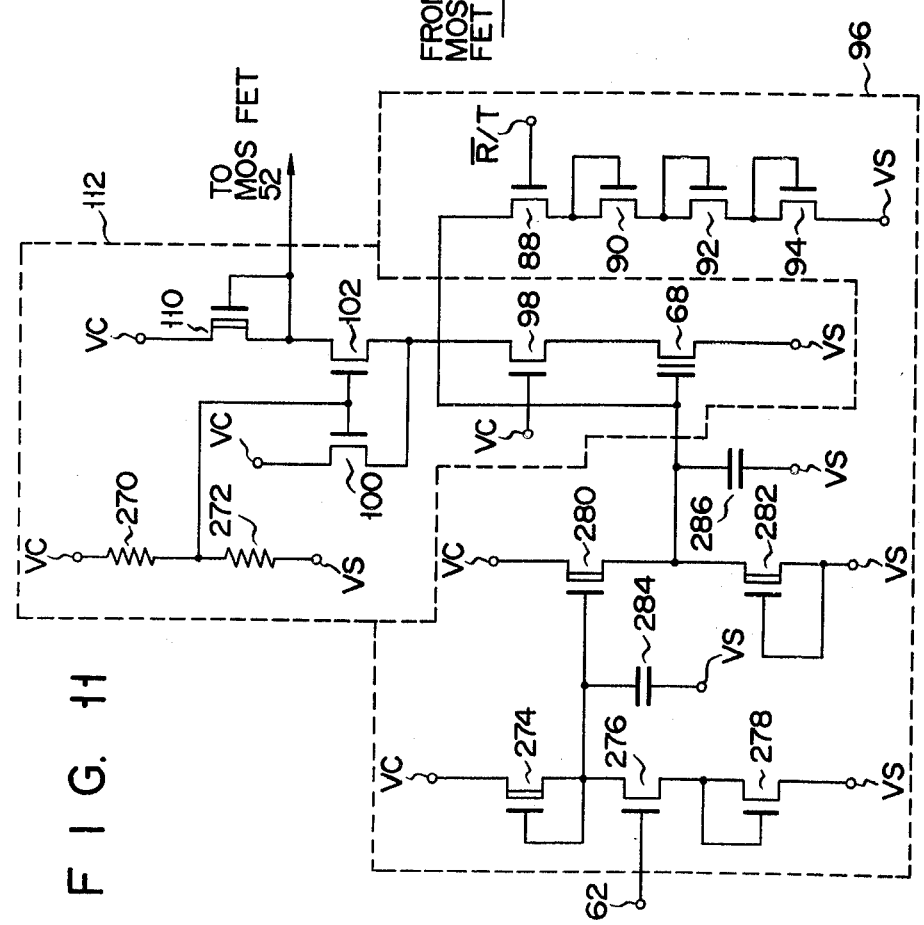
FIG. 11 is a circuit diagram showing a fifth embodiment of the nonvolatile semiconductor memory device of the invention.

FIG. 11 is a circuit diagram showing the principal part of a fifth embodiment of this invention. In the reference signal generator 112, resistors 270 and 272 are used in place of the MOS FETs 104 and 106 (FIG. 2B). Further, the gate signal generating section for testing is connected to the control gate of the MOS FET 68. In the gate signal generator 96, a D MOS FET 274 and MOS FETs 276 and 278, as well as D MOS FETs 280 and 282, are connected in series between the power supply terminal VC and the earth terminal VS. The output terminal 62 of the sense amplifier 40 is connected to the gate of the MOS FET 276. The junction of the D MOS FET 274 and MOS FET 276 is connected to the gate of the D MOS FET 280, and grounded through a capacitor 284. The junction of the D MOS FETs 280 and 282 is connected to the control gate of the MOS FET 68, and grounded through a capacitor 286.

Figure 12:
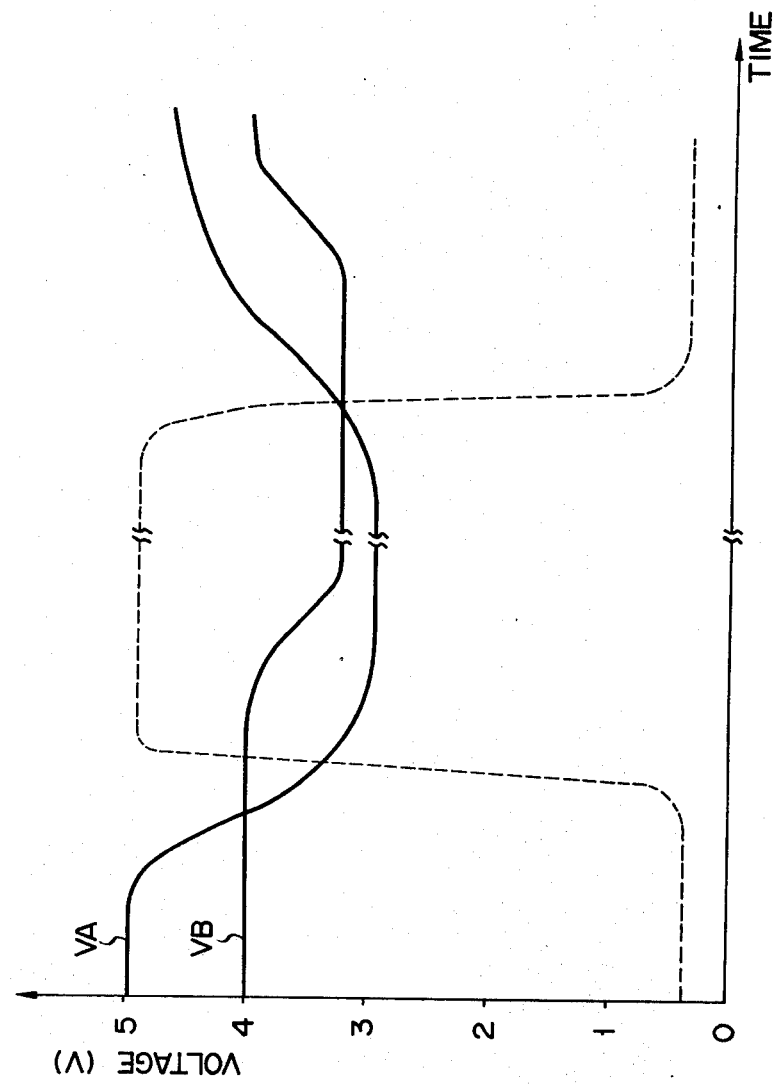
FIG. 12 is a graph for illustrating the operation of the fifth embodiment.

Referring now to the graph of FIG. 12, there will be described the operation of the fifth embodiment. In FIG. 12, the broken line represents the output data produced through an output buffer. When the output voltage VA of the memory array 10 is nearly 5 V, the output data is at low level, as indicated by the broken line. As a result, the gate voltages of the D MOS FET 280 and the MOS FET 68 are set to low level, the conductive resistance of the MOS FET 68 is increased, and the output voltage VB of the reference signal generator 112 is set to nearly 4 V. When the output voltage VA of the memory array 10 becomes less than VB, the level of the output terminal of the sense amplifier 40 is inverted to be low and the output data is also inverted, and the gate voltages of the D MOS FET 280 and the MOS FET 68 are switched to high level. Accordingly, the conductive resistance of the MOS FET 68 is reduced, and the reference signal VB is set to nearly 3 V. The reference voltage VB drops with some time delay after the memory array output voltage VA is reduced from 5 V to low level by the capacitors 284 and 286 as a delay line.

Thus, according to this embodiment, the time interval between the start of charge or discharge of the output line of the memory array 10 and the coincidence of the output voltage VA and the reference voltage VB is reduced to improve the memory data reading speed.

Figure 13:
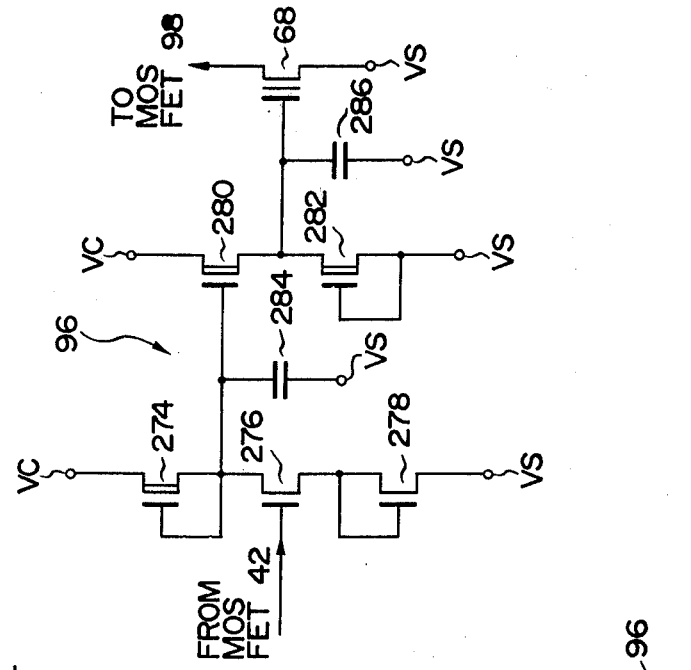
FIG. 13 is a circuit diagram showing a modification of the fifth embodiment.

In a modification of this embodiment, as shown in FIG. 13, the output signal of the memory array 10 may be used for the control input of the gate signal generator 96, i.e. the gate signal of the MOS FET 276.

According to this invention, as described above, there may be provided a nonvolatile semiconductor memory device of high reliability in which a reference signal for memory output decision depends on the supply voltage to different degrees at the time of normal reading and at the time of testing so that memory cell checking may be done before shipment, and in which the normal reading time is shortened without involving wrong data decision.

It is to be understood that this invention is not limited to the above-mentioned embodiments and modifications, and that various changes, other modifications and combinations thereof may be effected by one skilled in the art without departing from the scope or spirit of the invention.

What we claim is:

1. A nonvolatile semiconductor memory device comprising: memory array means, formed of a plurality of nonvolatile semiconductor memory elements each having a gate and a variable resistance path controlled by a respective gate with said elements arranged in columns and row to form of a matrix, for storing data in said gates to control the conductance of said paths and for producing an output signal corresponding to said stored data in a selected one of said elements;
   reference signal generator means for selectively generating either a first reference signal or a different second reference signal; and
   sense means for comparing the level of said output signal from said memory array means to the level of the selectively generated reference signal from said reference signal generating means, and for producing a signal representing the result of that comparison.

2. A nonvolatile semiconductor memory device according to claim 1, in which said reference signal generator means includes a reference signal generator having a switch element with a gate and a variable resistance path, the structural configuration of said gate and variable resistance path being substantially the same as the structural configuration of the gate and variable resistance path of said memory elements of said memory array means and with the conductive resistance of said path connected to said sense means to determine which of said first and second reference signals is generated, and said reference signal generator means further including a gate signal generator which generates one of two gate signals for controlling the conductive resistance of said path of said switch element.

3. A nonvolatile semiconductor memory device according to claim 2, including a power supply terminal for receiving a supply voltage to power said device; and in which device:
   (a) said memory array means includes floating gate metal oxide semiconductor field effect transistors (MOS FETs) as said memory elements, said MOS FETs each having a control gate, a floating gate and a variable resistance path;
   (b) said switch element of said reference signal generator comprises an additional floating gate MOS FET having a control gate, a floating gate, and a variable resistance path; and
   (c) said reference signal generator includes first means for connecting said variable resistance path of said additional floating gate MOS FET in series with said power supply terminal and second means for connecting the junction of said first means and said variable resistance path of said additional floating gate MOS FET to said sense means to supply said first and second reference signals to said sense means.

4. A nonvolatile semiconductor memory device according to claim 3, in which said gate signal generator supplies said control gate of said additional floating gate MOS FET with either a constant voltage or a voltage dependent on said supply voltage coupled to said power supply terminal.

5. A nonvolatile semiconductor memory device according to claim 4, in which said gate signal generator includes a plurality of floating gate MOS FETs which have a structural configuration substantially the same as the structural configuration of said additional floating gate MOS FET in said reference signal generator, and each having a floating gate and control gate connected to each other.

6. A nonvolatile semiconductor memory device according to claim 3, in which said gate signal generator supplies said control gate of said additional floating gate MOS FET with either a first constant voltage or a second constant voltage, and said reference signal generator produces said first reference signal when said first constant voltage is supplied and said reference signal generator produces said second reference signal when said second constant voltage is supplied, said second reference signal having a lower level than said first reference signal.

7. A nonvolatile semiconductor memory device according to claim 2, including first and second power supply terminals for receiving a supply voltage to power said device, and in which device:
(a) said memory array means includes floating gate metal oxide semiconductor field effect transistors (MOS FETs) as said memory elements, each having a control gate, floating gate, and variable resistance path;
(b) said gate signal generator includes an additional floating gate MOS FET which has a control gate, a floating gate, and a variable resistance path having a structural configuration the same as the structural configuration of said MOS FETs of said memory array means, switch means for selectively connecting said variable resistance path of said additional floating gate MOS FET in series with said first and second power supply terminals, and means for connecting said control gate and said floating gate of said additional floating gate MOS FET to each other; and
(c) means for connecting said gate signal generator to said gate of said switch element of said reference signal generator to provide a first gate signal upon opening of said switch means whose value is dependent on the voltage supplied to said first and second terminals, and a second gate signal upon closing of said switch means whose value is substantially constant.

8. A nonvolatile semiconductor memory device according to claim 2, including first and second power terminals for receiving a supply voltage to power said device, and wherein said gate signal generator has a switching transistor having a gate and a variable resistance path, a voltage generator coupled to said gate of said switching transistor to control operation of said switching transistor, and means for connecting one end of said variable resistance path of said switching transistor to both said first power terminal and said reference signal generator and for connecting the other end of said variable resistance path to said second power terminal, so that a first voltage signal from said power terminal is supplied to said reference signal generator when said switching transistor is open, said first voltage being dependent on the value of said supply voltage, and a constant second voltage is supplied to said reference signal generator when said switching transistor is closed.

9. A nonvolatile semiconductor memory device according to claim 2, including a column decoder coupled to said memory array means and having control signal outputs to select columns of said memory array means, and in which device said reference signal generator includes a plurality of first MOS FETs and second MOS FETs each having a gate and a variable resistance path, the variable resistance paths of each of said first MOS FETs being series connected to a variable resistance path of a respective second MOS FET, said series connections being equal in number to the number of the columns of said memory array means, the gates of said first MOS FETs being connected to receive said gate signals from said gate signal generator, and the gates of the second MOS FETs being connected to receive a corresponding control signal output of said column decoder of said memory array means.

10. A nonvolatile semiconductor memory device according to claim 2, including a row decoder coupled to said memory means and having control signal outputs to select rows of said memory array means, and in which device there are a plurality of said gate signal generators equal in number to the number of rows of said memory array means, said gate signal generators connected to be controlled by a corresponding control signal output of said row decoder of said memory array means, and said reference signal generator including a plurality of said switch elements, each comprising a floating gate MOS FET whose gate is connected to an output of a respective one of said gate signal generators.

11. A nonvolatile semiconductor memory device according to claim 2 in which said gate signal generator changes the level of said gate signals in accordance with output data from said memory array.

12. A nonvolatile semiconductor memory device according to claim 2, in which said gate signal generator has a delay element.

13. A nonvolatile semiconductor memory device according to claim 1, in which said first and second reference signals have different power supply voltage dependence characteristics with respect to each other.

14. A nonvolatile semiconductor memory device according to claim 1, in which said reference signal generator means comprises a reference signal generator having a plurality of MOS FETs and a gate signal generator for producing a voltage for gate-controlling said MOS FETs in said reference signal generator.

15. A nonvolatile semiconductor memory device according to claim 2, in which said gate signal generator selectively generates either a gate signal of a substantially constant voltage not substantially depending on power supply voltage or a gate signal of a voltage dependent on power supply voltage.

16. A nonvolatile semiconductor memory device powered by a source of voltage, said device comprising:
a memory array means, formed of nonvolatile semiconductor memory elements arranged in the form of a matrix, for storing data and for producing an output signal corresponding to said stored data;
means for selectively generating either a first or a second reference signal, said first reference signal varying less than said second reference signal when the power source voltage to said device varies; and
sense means for comparing in level said output signal from said memory means with a reference signal from said reference signal generating means and for producing a signal representing the result of that comparison.

17. A nonvolatile semiconductor memory device powered by a source of voltage, said device comprising:
memory array means, formed of nonvolatile semiconductor memory elements arranged in the form of a matrix, for storing data and for producing an output signal corresponding to said stored data;

means for selectively generating either a first or a second reference signal, both of said reference signals being dependent on the power source voltage, the power source voltage at which the level of said second reference signal is identical to the level of said output signal which indicates data is stored in said memory array being lower than the power source voltage at which the level of said first reference signal is identical to the level of the same output signal of said memory array; and sense means for comparing in level the output signal from said memory array with a reference signal from said reference signal generating means and for producing a signal representing the result of that comparison.

* * * * *